(12) United States Patent  
Ryou et al.

(10) Patent No.: US 12,397,529 B2  
(45) Date of Patent: Aug. 26, 2025

(54) DISPLAY DEVICE

(71) Applicant: Samsung Display Co., Ltd., Yongin-si (KR)

(72) Inventors: Hansun Ryou, Seoul (KR); Sanghyo Park, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 142 days.

(21) Appl. No.: 17/212,288

(22) Filed: Mar. 25, 2021

(65) Prior Publication Data

US 2022/0011814 A1    Jan. 13, 2022

(30) Foreign Application Priority Data

Jul. 9, 2020   (KR) .................. 10-2020-0084588

(51) Int. Cl.
*B32B 7/12*      (2006.01)
*B32B 3/16*      (2006.01)
(Continued)

(52) U.S. Cl.
CPC ................. *B32B 7/12* (2013.01); *B32B 3/16* (2013.01); *B32B 3/30* (2013.01); *B32B 7/14* (2013.01); *B32B 15/08* (2013.01); *G06F 1/1652* (2013.01); *G06F 1/1656* (2013.01); *H04M 1/0268* (2013.01); *B32B 2305/72* (2013.01); *B32B 2457/20* (2013.01); *G06F 2203/04102* (2013.01)

(58) Field of Classification Search
CPC .... B32B 7/12; B32B 7/14; B32B 3/16; B32B 3/30; B32B 15/08; B32B 2305/72; B32B 2457/20; G06F 1/1652; G06F 1/1656; G06F 2203/04102; Y10T 428/24479; Y10T 428/24612; Y10T 428/24752; Y10T 428/24802
USPC .............................. 428/156, 172, 189, 195.1
See application file for complete search history.

(56) References Cited

U.S. PATENT DOCUMENTS 9,333,725 B2 * 5/2016 Chuang ..................... B32B 7/14
10,429,895 B2   10/2019 Lee
(Continued)

FOREIGN PATENT DOCUMENTS

CN   110738933 A    1/2020
EP   3330833 A1    6/2018
(Continued)

OTHER PUBLICATIONS

Extended European Search Report for Application No. 21184226.5-1224 dated Apr. 14, 2022.
(Continued)

*Primary Examiner* — Megha M Gaitonde
(74) *Attorney, Agent, or Firm* — CANTOR COLBURN LLP

(57) ABSTRACT

A display device includes a display panel which is foldable at a folding area of the display panel, a plate which faces the display panel and is foldable together with the display panel, the plate including a bending portion corresponding to the folding area, a plurality of openings defined in the plate at the bending portion thereof and an adhesive film which is between the plate and the display panel and attaches the plate to the display panel, the adhesive film including a non-adhesive area corresponding to the bending portion of the plate.

16 Claims, 13 Drawing Sheets

(51) Int. Cl.
  *B32B 3/30* (2006.01)
  *B32B 7/14* (2006.01)
  *B32B 15/08* (2006.01)
  *G06F 1/16* (2006.01)
  *H04M 1/02* (2006.01)

(56) References Cited

U.S. PATENT DOCUMENTS

| | | | |
|---|---|---|---|
| 10,602,631 | B2 | 3/2020 | Song et al. |
| 2002/0114934 | A1* | 8/2002 | Liu .................... C09D 4/06 427/372.2 |
| 2018/0103553 | A1 | 4/2018 | Kim et al. |
| 2019/0204867 | A1 | 7/2019 | Song et al. |
| 2019/0305238 | A1 | 10/2019 | Shin et al. |
| 2019/0334114 | A1 | 10/2019 | Park |
| 2019/0357366 | A1 | 11/2019 | Choi et al. |
| 2020/0119290 | A1 | 4/2020 | Shin |

FOREIGN PATENT DOCUMENTS

| | | |
|---|---|---|
| EP | 3564778 A1 | 11/2019 |
| EP | 3644383 A1 | 4/2020 |
| KR | 1020160017843 A | 2/2016 |
| KR | 1020180062195 A | 6/2018 |
| KR | 1020190065640 A | 6/2019 |
| KR | 1020190081281 A | 7/2019 |
| KR | 1020190082339 A | 7/2019 |
| KR | 1020190124844 A | 11/2019 |
| KR | 1020190132604 A | 11/2019 |
| WO | 2020105794 | 5/2020 |

OTHER PUBLICATIONS

The Partial European Search Report for European Patent Application No. 21184226.5 dated Dec. 2, 2021.

* cited by examiner

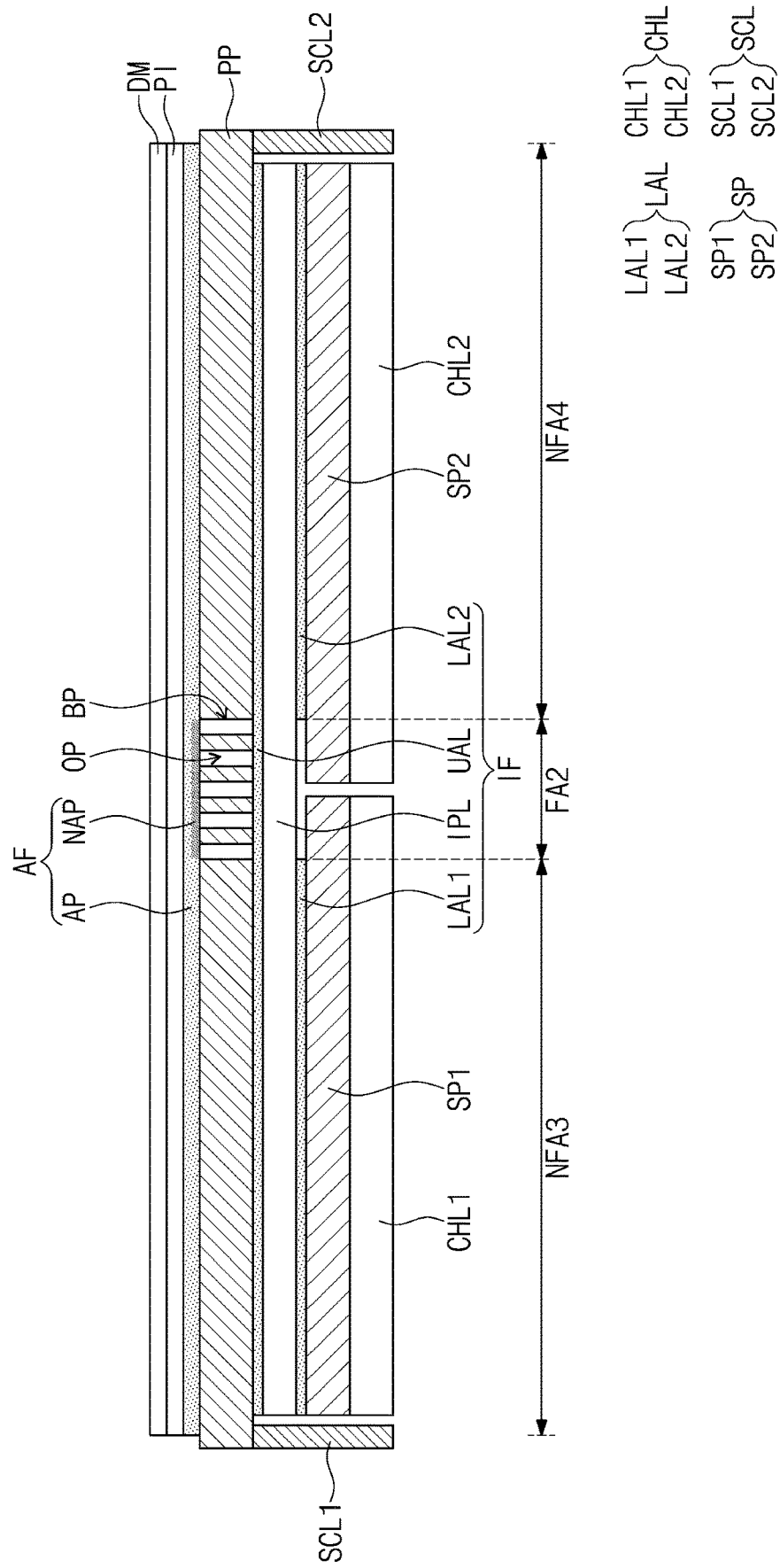

DISPLAY DEVICE

This application claims priority to Korean Patent Application No. 10-2020-0084588, filed on Jul. 9, 2020, and all the benefits accruing therefrom under 35 U.S.C. § 119, the entire contents of which are hereby incorporated by reference.

BACKGROUND

(1) Field

The disclosure herein relates to a display device, and more particularly, to a display device having improved reliability.

(2) Description of the Related Art

A display device displays various images on a display screen to provide information to a user. In general, the display device displays information within an assigned display screen. Flexible display devices including a foldable flexible display panel have been developed. The flexible display device may be foldable, rollable or bendable unlike a rigid display device. The flexible display device, which is variously changeable in shape, may be transported regardless of a screen size to thus improve convenience of a user.

SUMMARY

Embodiments of the invention provide a display device having improved reliability.

An embodiment provides a display device including a display panel which is foldable at a folding area of the display panel, a plate which faces the display panel and is foldable together with the display panel, the plate including a bending portion corresponding to the folding area, a plurality of patterns defined in the plate at the bending portion thereof, an adhesive film which is between the plate and the display panel and attaches the plate to the display panel, the adhesive film including a non-adhesive area corresponding to the bending portion of the plate, and a support plate which is disposed below the plate, the support plate comprising a first support plate and a second support plate spaced apart from each other at the bending portion of the plate.

In an embodiment, a display device includes a display panel which is foldable and includes a folding area and a non-folding area which is adjacent to the folding area, a plate which faces the display panel and is foldable together with the display panel, the plate including a bending portion corresponding to the folding area of the display panel, a plurality of openings defined in the plate at the bending portion thereof, an adhesive film which is between the plate and the display panel and attaches the plate to the display panel, the adhesive film including a non-adhesive area corresponding to the bending portion of the plate, and a support plate which is disposed below the plate, the support plate comprising a first support plate and a second support plate spaced apart from each other at the bending portion of the plate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIG. 9 is a cross-sectional illustrating an embodiment of a display device which is unfolded.

DETAILED DESCRIPTION

Figure 1:
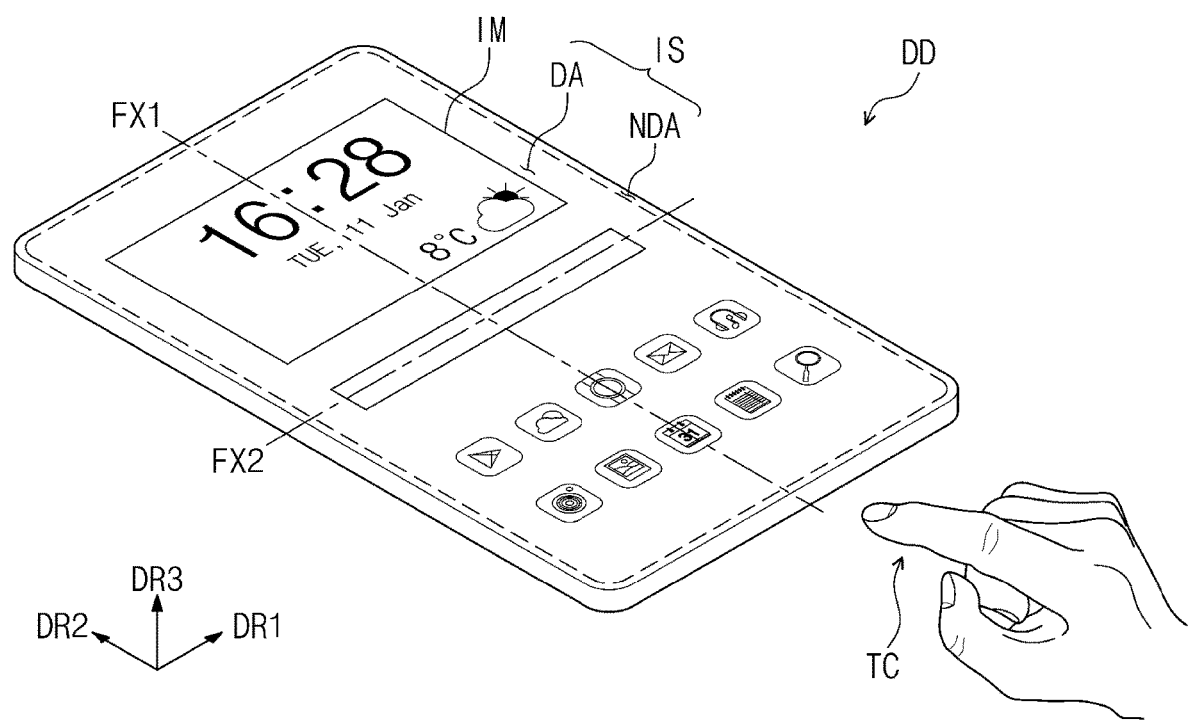
FIG. 1 is a perspective view illustrating an embodiment of a display device.

It will be understood that when an element such as a region, layer, or portion is referred to as being related to another element such as being "on" another element, it can be directly on the other element or intervening elements may also be present. In contrast, when an element such as a region, layer, or portion is referred to as being related to another element such as being "directly on" another element, no other element or intervening element is present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term and/or includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, spatially relative terms, such as "below," "lower," "above," and "upper" may be used herein for ease of description to describe an element and/or a feature's relationship to another element(s) and/or feature(s) as illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

FIG. 1 is a perspective view illustrating an embodiment of a display device DD.

Referring to FIG. 1, a display device DD may have a rectangular shape having a short side extending along a first direction DR1 and a long side extending along a second direction DR2 which crosses the first direction DR1. However, the invention is not limited to the above-described shape of the display device DD. In an embodiment, for example, the display device DD may have various shapes.

The display device DD may be a foldable electronic device. Specifically, the display device DD may be foldable with respect to a folding axis extending in a predetermined direction. Hereinafter, the display device DD which is flat without being folded may be defined as being in a first state (e.g., a non-folded state), and the display device DD which is folded with respect to the folding axis may be defined as being in a second state (e.g., a folded state). The folding axis as a rotation axis about which the display device DD is foldable may be provided by a mechanical structure of the display device DD.

The folding axis may extend along the first direction DR1 or the second direction DR2. In an embodiment, the folding axis extending along the second direction DR2 is defined as a first folding axis FX1, and the folding axis extending along the first direction DR1 is defined as a second folding axis FX2. The display device DD may include at least one folding axis. That is, the display device DD may include at least one of the first folding axis FX1 and the second folding axis FX2.

The display device DD may include large-sized display devices such as televisions and display monitors, and small and middle-sized display devices such as mobile phones, tablet computers, navigation units for vehicles and game consoles. However, these are merely examples, and other display devices are adaptable without departing from the concept of the present disclosure.

As illustrated in FIG. 1, the display device DD may display an image IM on a display surface IS. The display device DD which is flat may dispose the display surface IS parallel to a plane defined by the first direction DR1 and the second direction DR2. The image IM may be displayed in a third direction DR3 which crosses each of the first direction DR1 and the second direction DR2. The display surface IS at which the image IM is displayed may correspond to a front surface of the display device DD.

The display surface IS of the display device DD may be divided into a plurality of areas. That is, the display surface IS may include a display area DA and a non-display area NDA which is adjacent to the display area DA. Various components and layers of the display device DD may have a display area DA and a non-display area NDA corresponding to those described above.

The display area DA may be an area at which the image IM is displayed and the image IM is recognized from outside the display device DD. The display area DA may have a rectangular shape. In an embodiment, the non-display area NDA may surround the display area DA, without being limited thereto. Thus, a shape of the display area DA may be substantially defined by the non-display area NDA. However, this is merely illustrated an example. In an embodiment, for example, the non-display area NDA may be disposed adjacent to only one side of the display area DA or omitted completely from the front surface of the display device DD. The display device DD may include various embodiments, and is not limited to any one embodiment.

The non-display area NDA is an area which is adjacent to the display area DA and at which the image IM is not displayed. The non-display area NDA may define a bezel area of the display device DD.

The display device DD may sense an external input TC applied from outside of the display device DD. In an embodiment, for example, the external input TC includes various types of inputs such as from a portion of a body, light, heat or pressure. In the embodiment, the external input TC is illustrated as being from a body part (e.g., hand) applied to the front surface of the display device DD. However, this is merely illustrated as an example. As described above, the external input TC may be provided with various types of input tools, and the display device DD may sense the external input TC applied to a side surface and/or a rear surface of the display device DD according to a structure of the display device DD. However, the invention is not limited thereto.

The display device DD may activate the display surface IS to display the image IM and simultaneously sense the external input TC. In an embodiment, an area for sensing the external input TC is provided in the display area DA in which the image IM is displayed. However, this is merely illustrated as an example. The area for sensing the external input TC may be provided in the non-display area NDA and/or an entirety of an area of the display surface IS.

Figure 2A:
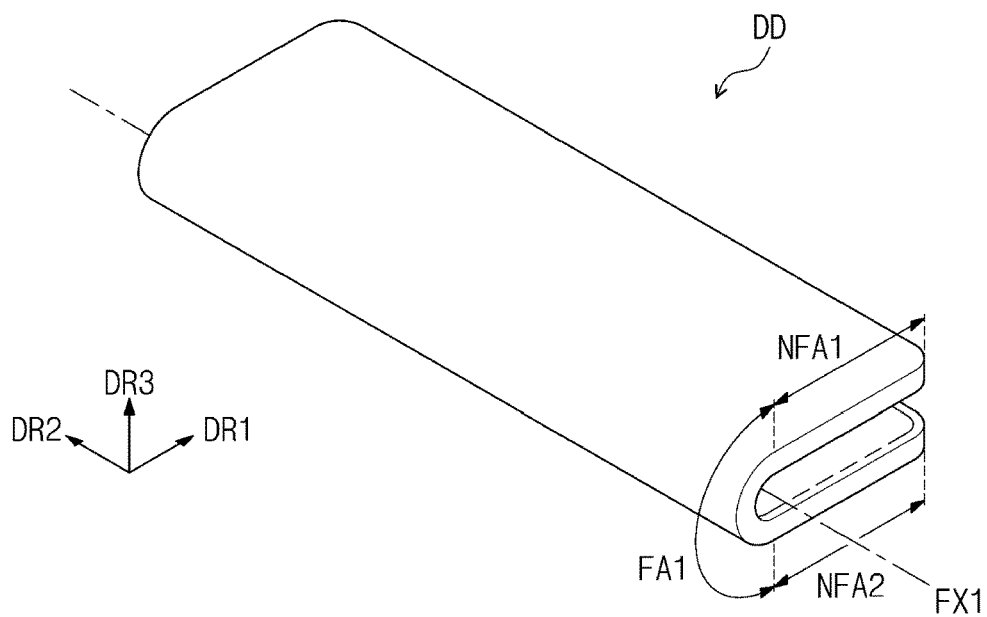
FIG. 2A is a view illustrating the display device in FIG. 1 which is in-folded along a first folding axis.
Figure 2B:
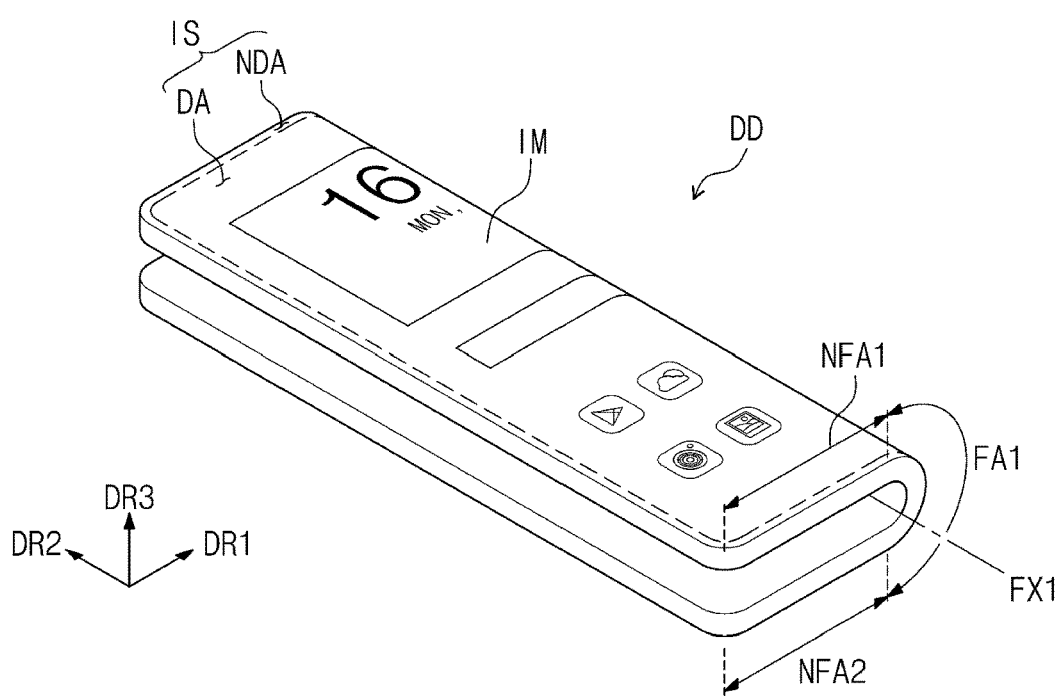
FIG. 2B is a view illustrating the display device in FIG. 1 which is out-folded along the first folding axis.

FIG. 2A is a view illustrating the display device DD in FIG. 1 which is in-folded along the first folding axis FX1, and FIG. 2B is a view illustrating the display device DD in FIG. 1 which is out-folded along the first folding axis FX1.

Referring to FIGS. 1 and 2A, the display device DD may be a foldable display device. The display device DD may be foldable with respect to a folding axis (e.g., the first folding axis FX1 and/or the second folding axis FX2) extending in a predetermined direction. Various components or layers of the display device DD may be foldable together with each other in folding and/or unfolding of the display device DD. That is, various components and layers of the display device DD may have a folding axis, a folding area and a non-folding area corresponding to those described below.

A plurality of areas may be defined in the display device DD according to an operation type of the display device DD. The plurality of areas may be divided into a first folding area FA1 and at least one non-folding area. In FIGS. 2A and 2B, the first folding area FA1 is defined between two non-folding areas.

The first folding area FA1 is an area at which the display device DD is foldable about the first folding axis FX1. The display device DD which is folded at the first folding area FA1 defines a curvature at the first folding area FA1. Here, the first folding axis FX1 may extend along the second direction DR2, e.g., a major axis of the display device DD. The first folding area FA1 is defined as an area of the display device DD which is foldable about the first folding axis FX1 and having a major dimension extending along the second direction DR2.

In an embodiment, the display device DD may include a first non-folding area NFA1 and a second non-folding area NFA2. The first non-folding area NFA1 is adjacent to one side of the first folding area FA1 along the first direction DR1, and the second non-folding area NFA2 is adjacent to an opposing side of the first folding area FA1 along the first direction DR1. A non-folding area may be an area of the display device DD which is unfoldable and/or which remains flat even when the display device DD is folded at a respective folding area. The first non-folding area NFA1, the first folding area FA1 and the second non-folding area NFA2 may be in order along the first direction DR1.

The display device DD may be in-folded or out-folded. A state of the display device DD being folded so that different display surface portions at the first and second non-folding areas NFA1 and NFA2 face each other is defined as an in-folding state, and a state of the display device DD being folded so that different display surface portions at the first and second non-folding areas NFA1 and NFA2 face in opposite directions from each other is defined as an out-folding state.

Here, an in-folding state refers to a state of the display device DD which is folded so that portions of the front surface of the display device DD face each other, and the out-folding state refers to a state of the display device DD which is folded so that portions of rear surface of the display device DD face each other.

The display device DD in FIG. 2A may be in-folded so that the display surface IS at the first non-folding area NFA1 and the display surface IS at the second non-folding area NFA2 face each other. As the first non-folding area NFA1 is rotatable clockwise along the first folding axis FX1, the display device DD may be in-folded. The first folding axis FX1 may be defined at a center of the display device DD along the first direction DR1 so that the display device DD is in-foldable to align the first non-folding area NFA1 with the second non-folding area NFA2.

Referring to FIG. 2B, the display device DD may be out-folded with respect to the first folding axis FX1. In the out-folded state, the display device DD may display the image IM through the display surface IS at the first non-folding area NFA1 and the display surface IS at the second non-folding area NFA2, which are facing outside the display device DD. In addition, in the out-folded state, the display device DD may display the image IM through the display surface IS at the first folding area FA1 which faces outside of the display device DD. As illustrated in FIG. 1, the display device DD may display the image IM in an unfolded state (e.g., the display device DD which is flat). The first non-folding area NFA1, the second non-folding area NFA2 and the first folding area FA1 may individually display an image IM to provide independent information or individually display portions of a single one of the image IM to provide one single piece of information.

The display device DD may be provided to be both in-foldable and out-foldable, or may be provided to be only one of in-foldable and out-foldable.

Figure 3A:
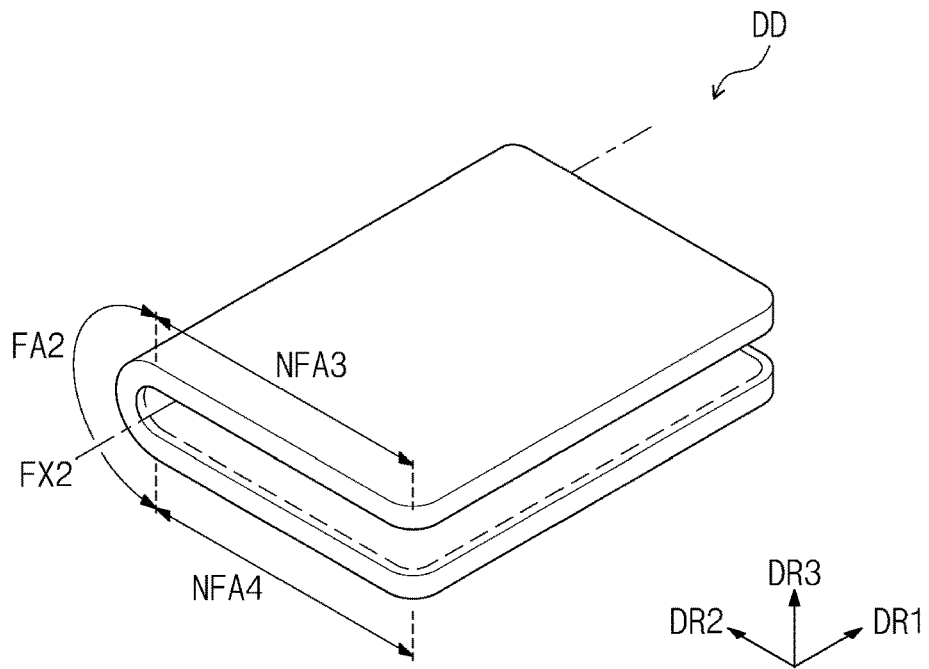
FIG. 3A is a view illustrating the display device in FIG. 1 which is in-folded along a second folding axis.
Figure 3B:
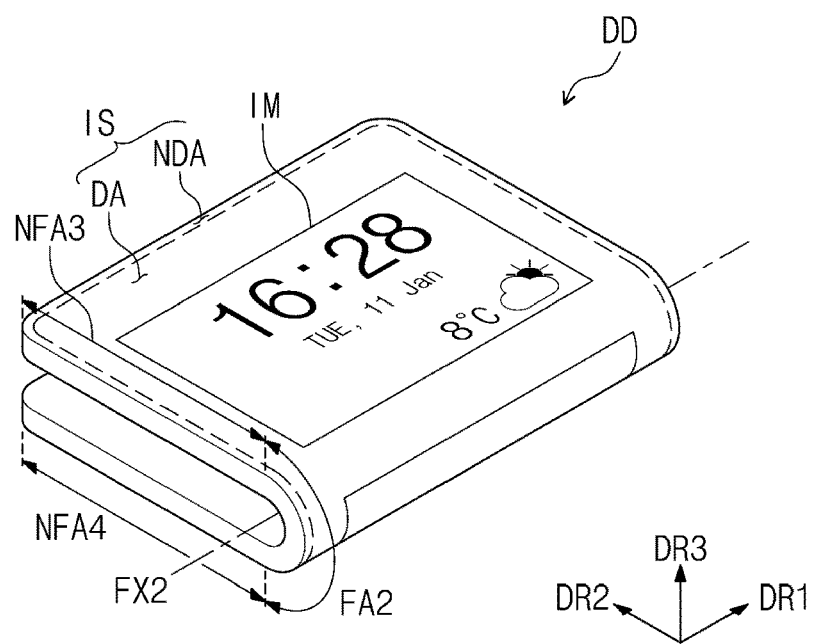
FIG. 3B is a view illustrating the display device in FIG. 1 which is out-folded along the second folding axis.

FIG. 3A is a view illustrating the display device DD in FIG. 1 which is in-folded along a second folding axis FX2, and FIG. 3B is a view illustrating the display device DD in FIG. 1 which is out-folded along the second folding axis FX2.

Referring to FIGS. 3A and 3B, the display device DD may be in-folded or out-folded with respect to the second folding axis FX2. The second folding axis FX2 may extend along the first direction DR1, e.g., a minor axis of the display device DD.

A plurality of areas may be defined in the display device DD according to the operation type of the display device DD. The plurality of areas may be divided into a second folding area FA2 and at least one non-folding area. In FIGS. 3A and 3B, the second folding area FA2 is defined between two non-folding areas.

The second folding area FA2 is an area at which the display device DD is foldable based on the second folding axis FX2. The display device DD which is folded at the second folding area FA2 defines a curvature at the second folding area FA2. The second folding area FA2 is defined as an area of the display device DD which is foldable based on the second folding axis FX2 and having a major dimension extending along the first direction DR1.

In an embodiment, the display device DD may include a third non-folding area NFA3 and a fourth non-folding area NFA4. The third non-folding area NFA3 is adjacent to one side of the second folding area FA2 along the second direction DR2, and the fourth non-folding area NFA4 is adjacent to an opposing side of the second folding area FA2 along the second direction DR2.

Although one folding area is illustrated in the display device DD, the invention is not limited thereto. According to an embodiment, a plurality of folding areas may be defined in the display device DD.

Figure 4:
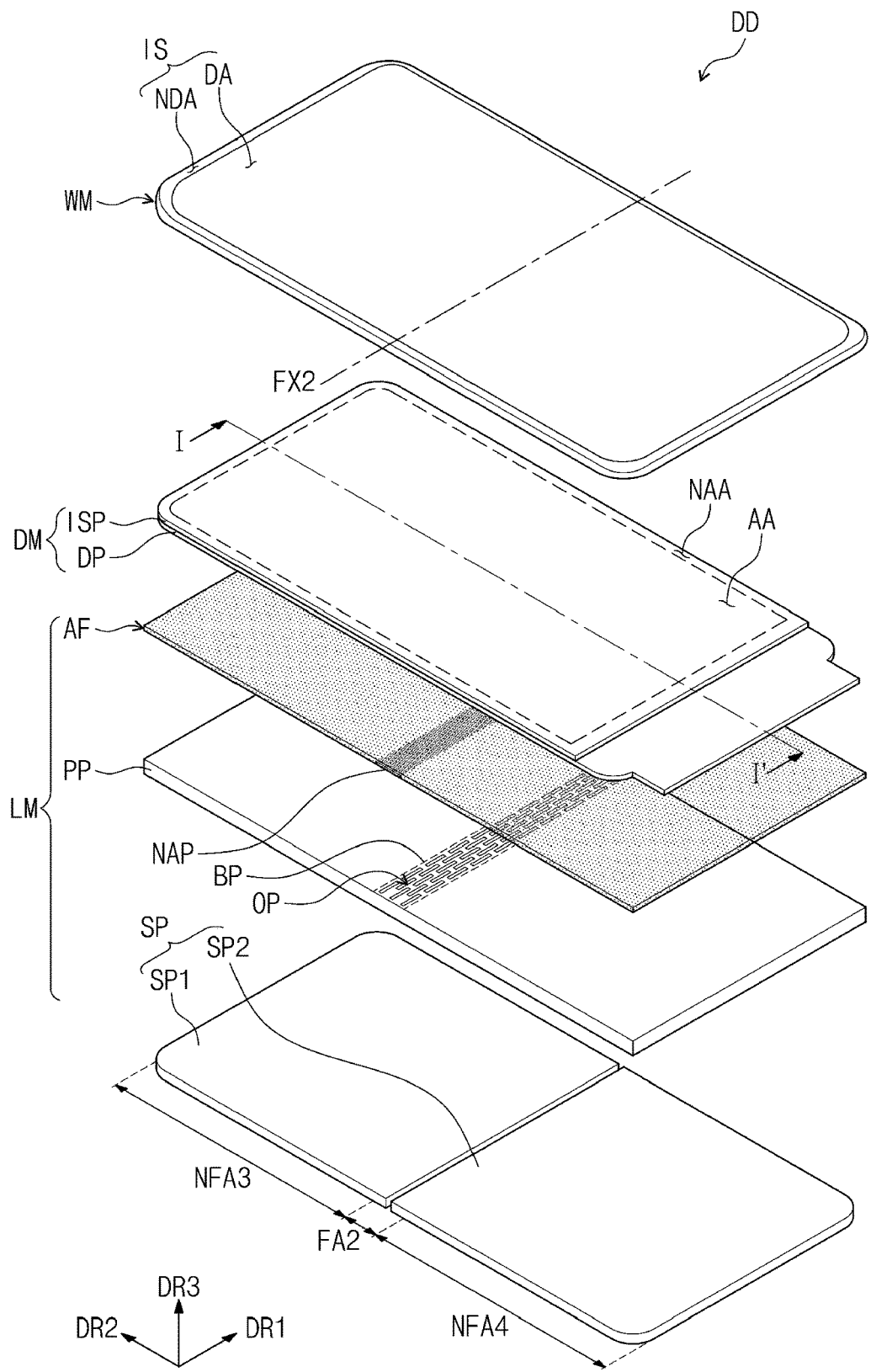
FIG. 4 is an exploded perspective view illustrating an embodiment of a display device.
Figure 5A:
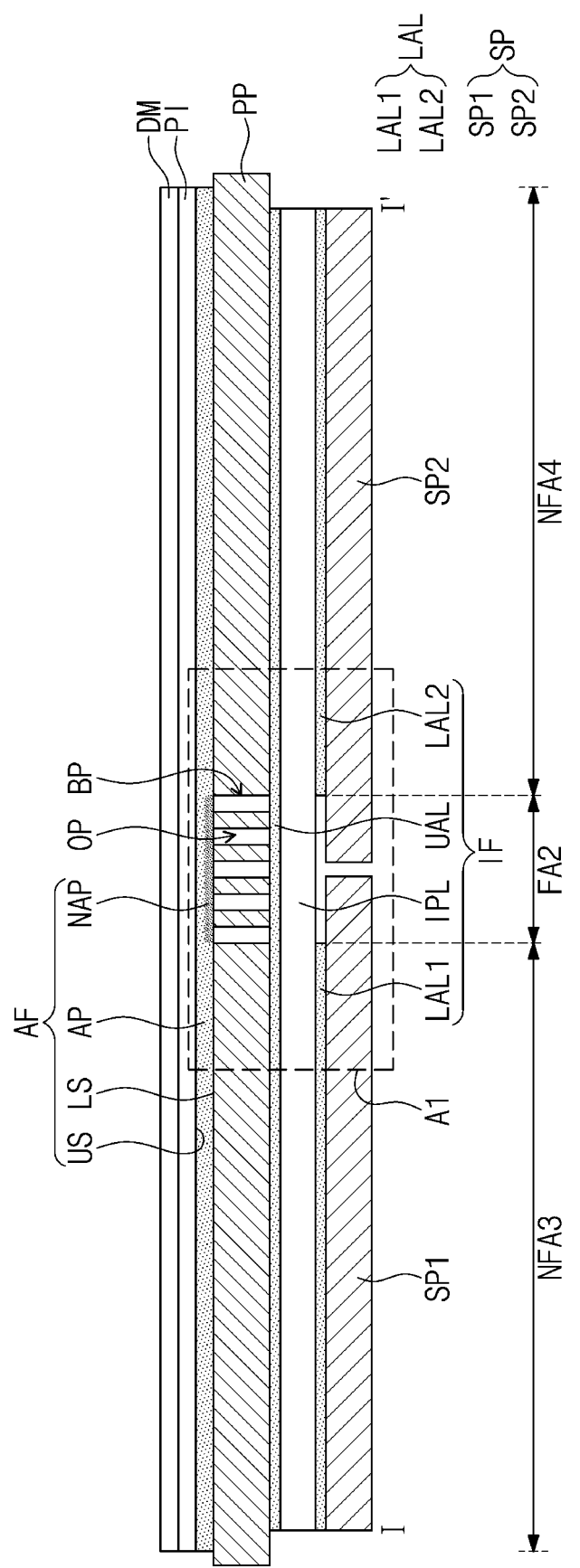
FIG. 5A is a cross-sectional view taken along line I-I' in FIG. 4.
Figure 5B:
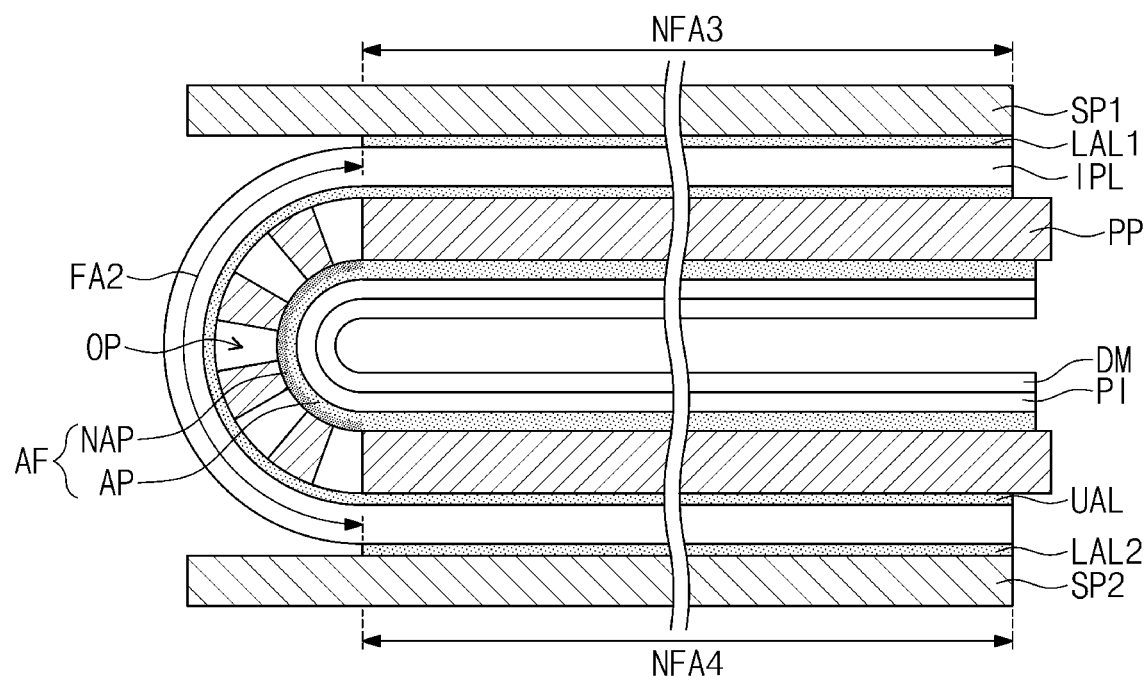
FIG. 5B is a cross-sectional view illustrating the display device in FIG. 5A which is folded.

FIG. 4 is an exploded perspective view illustrating an embodiment of the display device DD, FIG. 5A is a cross-sectional view taken along line I-I' in FIG. 4 and illustrating the display device DD which is unfolded or flat, and FIG. 5B is a cross-sectional view illustrating the display device DD in FIG. 5A which is folded.

Referring to FIGS. 4 and 5A, the display device DD may include a display module DM for displaying an image IM, an upper module disposed on the display module DM, and a lower module LM disposed below the display module DM. The display module DM may constitute one portion of the display device DD, and particularly may generate an image IM, generate light for an image IM, emit the light for the image IM, etc.

The display module DM may include a display panel DP and an input sensing unit ISP (e.g., input sensing layer). The display panel DP may be a light emitting display panel. However, the invention is not particularly limited thereto. In an embodiment, for example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot or a quantum rod. Hereinafter, the display panel DP will be described as the organic light emitting display panel.

The display panel DP may be a flexible display panel. Thus, the display panel DP may be rollable and/or the display panel DP may be foldable and/or unfoldable with respect to one or more of a folding axis such as the second folding axis FX2.

The input sensing unit ISP may be directly disposed on the display panel DP. According to an embodiment, the input sensing unit ISP may be provided on the display panel DP through a continuous process. That is, when the input sensing unit ISP is directly disposed on the display panel DP, an intervening member such as an adhesive member is not disposed between the input sensing unit ISP and the display panel DP. However, the invention is not limited thereto.

In an embodiment, for example, the adhesive member may be disposed between the input sensing unit ISP and the display panel DP. Here, instead of being provided by a continuous process with the display panel DP, the input sensing unit ISP may be separately provided or manufactured such as through a process separated from the display panel DP and then subsequently fixed to an upper surface of the display panel DP by an intervening member such as the adhesive member.

The display panel DP generates an image IM, and the input sensing unit ISP acquires coordinate information of an external input TC (e.g., a touch event or proximity event) relative to the display device DD.

The upper module may include a window WM disposed on the display module DM. The window WM may contain an optically clear insulating material. Thus, the image IM generated from the display module DM may pass through the window WM and be easily recognized from outside the display device DD.

In an embodiment, for example, the window WM may include a thin-film glass or a synthetic resin film. When the window WM includes thin-film glass, the window WM may have a thickness along the third direction DR3 (e.g., thickness direction) of about 80 micrometers (μm) or less, e.g., about 30 μm. However, the thickness of the window WM is not limited thereto.

When the window WM includes a synthetic resin film, the window WM may include a polyimide ("PI") film or a polyethylene terephthalate ("PET") film.

The window WM may have a multi-layer structure or a single-layer structure. In an embodiment, for example, the window WM may include a plurality of synthetic resin films coupled to each other by an adhesive member, or a glass layer and a synthetic resin film coupled to each other by an adhesive member. The window WM may include or be made of a flexible material. Thus, the window WM may be foldable and/or unfoldable with respect to a folding axis such as the second folding axis FX2. That is, a shape of the window WM may be deformed together with the display module DM.

The window WM transmits the image IM from the display module DM and simultaneously relieves an external impact to the underlying layers of the display device DD to prevent the display module DM from being damaged or malfunctioning by the external impact. The external impact represents a force causing a defect to the display module DM, e.g., an external force such as a pressure or a stress.

The upper module may further include a protection layer disposed on the window WM. The protection layer may improve an impact resistance and reduce or prevent scattering of broken pieces when the window WM is broken. The window WM and/or the protection layer may define an outermost surface of the display device DD, without being limited thereto. The protection layer may include at least one selected from a urethane-based resin, an epoxy-based resin, a polyester-based resin, a polyether-based resin, an acrylate-based resin, an acrylonitrile-butadiene-styrene ("ABS") resin and rubber. In an embodiment, the protection layer may include at least one of phenylene, polyethyleneterephthalate ("PET"), polyimide ("PI"), polyamide ("PAI"), polyethylene naphthalate ("PEN") and poly carbonate ("PC").

Also, the upper module may further include at least one functional layer disposed between the display module DM and the window WM. In an embodiment, the functional layer may be an anti-reflection layer blocking external light reflection. The anti-reflection layer may reduce or effectively prevent elements constituting the display module DM from being recognized from outside the display device DD by external light incident through the front surface of the display device DD.

The anti-reflection layer may include a retarder and a polarizer. The retarder may be a film type retarder or a liquid crystal coating type retarder and include a $\lambda/2$ retarder and/or a $\lambda/4$ retarder. The polarizer may be also a film type polarizer or a liquid crystal coating type polarizer. The film type polarizer may include a flexible synthetic resin film, and the liquid crystal coating type polarizer may include liquid crystals arranged in a predetermined arrangement. The retarder and the polarizer may be realized by one polarizing film. The functional layer may further include a protection film disposed on or below the anti-reflection layer.

The display module DM may display an image IM according to an electrical signal and transceive information on an external input TC. The display module DM may be defined by an active area AA and a peripheral area NAA. The active area AA may be defined as an area at which an image IM is emitted by the display module DM.

The peripheral area NAA is disposed adjacent to the active area AA. In an embodiment, for example, the peripheral area NAA may surround the active area AA. However, this is merely illustrative. The peripheral area NAA may have various shapes. However, the invention is not limited to the illustrated shape of the peripheral area NAA. According to an embodiment, the active area AA of the display module DM may correspond to the display area DA of the display device DD.

The lower module LM includes a plate PP (e.g., first plate) disposed on a rear surface of the display module DM to support the display module DM. The plate PP may have a plate shape. In an embodiment, the plate PP may be defined by a single piece of solid material and having a planar size corresponding to a planar size the display module DM. Also, the plate PP may include a metal material. That is, the plate PP may be a metal plate. In an embodiment, the plate PP may include stainless steel, aluminum, or an alloy thereof. Alternatively, the plate PP may include a non-metal material, for example glass or plastic. The plate PP may have mechanical strength greater than a mechanical strength of the display module DM.

The plate PP may include a bending part BP (e.g., bending portion) at which the plate PP is bendable and in which a pattern OP is provided in plural including a plurality of patterns OP. The plurality of patterns OP may be arranged spaced apart from each other in the bending part BP with a predetermined gap between patterns OP which are adjacent to each other. Within the bending part BP, the plurality of patterns OP may be arranged in a zigzag form.

Each of the plurality of patterns OP may be an opening passing through a thickness of the plate PP such as to be open at both of opposing surfaces of the plate PP. However, the invention is not limited thereto. That is, each of the plurality of patterns OP may be a groove recessed from one surface (an upper surface or a lower surface) of the plate PP, such as to be open at only the one surface.

Each of the plurality of patterns OP may have a rectangular shape having a major dimension extending along the first direction DR1 within the second folding area FA2. That is, the major dimension of the plurality of patterns OP may be parallel to the second folding axis FX2. However, the shape of each of the plurality of patterns OP is not limited thereto. In an embodiment, for example, each of the plurality of patterns OP may have a rhombus shape or a circular shape having a dimension extending parallel to the second folding axis FX2.

As the plurality of patterns OP is provided in the bending part BP, the bending part BP may have increased flexibility. The plate PP may support the display module DM and allow the display device DD to be easily folded.

The bending part BP of the plate PP may include a plurality of support bars. Each of the support bars has a bar shape extending along the first direction DR1. The bending part BP may include a plurality of patterns OP provided between the plurality of support bars. Each of the plurality of patterns OP may be a slit pattern. Referring to FIG. 5A, for example, each of the support bars may be a solid portion of the plate PP having a thickness larger than a thickness of the plate PP at the plurality of patterns OP. The plurality of support bars may be spaced apart from each other by a plurality of slit patterns. Each of the plurality of support bars may have a rectangular shaped cross-sectional structure defined along the second direction DR2 and the third direction DR3. However, the cross-sectional shape of each of the plurality of support bars is not limited thereto. In an embodiment, for example, each of the plurality of support bars may have a trapezoidal shape or a triangular shape.

The lower module LM further includes an adhesive film AF disposed between the plate PP and the display module DM. The adhesive film AF may include an optically clear adhesive material. In an embodiment, the adhesive film AF may include a pressure sensitive adhesive ("PSA"), an optical clear adhesive ("OCA") or an optical clear resin ("OCR").

The adhesive film AF may include an adhesive part AP (e.g., adhesive portion) having an adhesive force and a non-adhesive part NAP (e.g., non-adhesive portion) having no adhesive force. The adhesive film AF further includes a bottom surface LS facing the plate PP and a top surface US opposite to the bottom surface LS. That is, the bottom surface LS is closer to the plate PP than the top surface US. The non-adhesive part NAP may be provided at a surface of the adhesive film AF which faces the plate PP (e.g., the bottom surface LS). In an embodiment, the non-adhesive area of the adhesive film AF extends from the bottom surface LS in a direction away from the plate PP. In an embodiment, the non-adhesive part NAP may be defined as an area in which a thickness of the adhesive film AF is partially removed or an area processed to reduce or exclude an adhesive force. Thus, the adhesive film AF may not attached to the bending part BP of the plate PP by the non-adhesive part NAP. That is, the non-adhesive part NAP may be unattachable to or removably detachable from the plate PP at the bending part BP thereof The non-adhesive part NAP may be provided at a position corresponding to the second folding area FA2. The non-adhesive part NAP may have a width corresponding to the second folding area FA2 along the second direction DR2, and a length which extends along the first direction DR1.

The non-adhesive part NAP may overlap or correspond to the bending part BP of the plate PP. The non-adhesive part NAP which is processed may have an inclination different from the adhesive part AP. In an embodiment, the non-adhesive part NAP may have a hardness which is higher than a hardness of the adhesive part AP. Since the non-adhesive part NAP having the higher hardness overlaps the bending part BP, although a folding stress is applied to the adhesive film AF during a folding operation of the display device DD, a phenomenon in which the adhesive film AF is permeated into the plurality of patterns OP of the plate PP may be reduced or prevented. Deformation of the plurality of patterns OP provided to the plate PP may be reduced, and thus a phenomenon in which the plurality of patterns OP are visually recognized may be prevented or reduced.

A structure of the non-adhesive part NAP will be described in detail later with reference to FIGS. 6A to 6D.

The lower module LM further includes a protection film PI disposed between the display module DM and the adhesive film AF. The protection film PI may be disposed below the display module DM to protect the rear surface of the display module DM. The protection film PI may include a synthetic resin film, e.g., a polyimide ("PI") film or a polyethylene terephthalate ("PET") film. However, the invention is not limited to the above-described examples of the protection film PI. Also, an adhesive member may be further provided between the protection film PI and the display module DM. Thus, the protection film PI may be attached to the rear surface of the display module DM by the adhesive member.

The lower module LM may further include a support plate SP (e.g., second plate). The support plate SP may include a plurality of support plate portions which correspond to the non-folding areas, respectively. In an embodiment, the support plate SP may include a first support plate SP1 and a second support plate SP2 which is spaced apart from the first support plate SP1. That is, the first support plate SP1 and the second support plate SP2 may be disconnected at the second folding area FA2. The display device DD which is unfolded may dispose the first support plate SP1 and the second support plate SP2 coplanar with each other, without being limited thereto.

The first and second support plates SP1 and SP2 may be disposed in correspondence to the third and fourth non-folding areas NFA3 and NFA4. The first support plate SP1 is disposed in correspondence to the third non-folding area NFA3 of the display module DM, and the second support plate SP2 is disposed in correspondence to the fourth non-folding area NFA4 of the display module DM. The first support plate SP1 overlaps or corresponds to a first portion of the plate PP, and the second support plate SP2 overlaps or corresponds to a second portion of the plate PP.

Each of the first and second support plates SP1 and SP2 may contain a metal material. That is, each of the first and second support plates SP1 and SP2 may be a metal plate. Alternatively, each of the first and second support plates SP1 and SP2 may include a non-metal material, for example glass or plastic. In an embodiment, each of the first and second support plates SP1 and SP2 may include or be made of the same material as the plate PP. Also, each of the first and second support plates SP1 and SP2 may have a thickness equal to or less than that of the plate PP.

The display module DM which is unfolded or flat disposes the first and second support plates SP1 and SP2 spaced apart from each other along the second direction DR2. The display module DM which is folded with respect to the second folding axis FX2 disposes the first and second support plates SP1 and SP2 spaced apart from each other along the third direction DR3.

The first and second support plates SP1 and SP2 may be spaced apart from each other at the second folding area FA2. The first and second support plates SP1 and SP2 may partially overlap the second folding area FA2. That is, a distance between the first and second support plates SP1 and SP2 along the second direction DR2 may be less than a width of the second folding area FA2 along the second direction DR2.

The support plate SP may further include a connection module for connecting the first and second support plates SP1 and SP2 to each other. The connection module may include a hinge module or a polyarticular module.

Although the support plate SP includes two support plate portions, the invention is not limited thereto. That is, the display device DD including more than one folding axis, the support plate SP may include a plurality of support plate portions separated from each other with respect to the plurality of folding axes.

Referring to FIGS. 4, 5A and 5B, the lower module LM may further include a lower film IF. The lower film IF includes a high restoration layer IPL, an upper adhesive layer UAL disposed between the plate PP and the high restoration layer IPL, and a lower adhesive layer LAL disposed on a rear surface of the high restoration layer IPL. That is, the upper adhesive layer UAL faces the lower adhesive layer LAL with the high restoration layer IPL therebetween.

The high restoration layer IPL may include a material having a high restoration force. The high restoration layer IPL may be referred to as a shape restoring layer. In an embodiment, the high restoration layer IPL may include an elastomer. In an embodiment, for example, the high restoration layer IPL may include polyurethane. When the high restoration layer IPL includes polyurethane, the high restoration layer IPL may have a thickness of about 10 μm to about 100 μm.

When the lower film IF includes the high restoration layer IPL as described above, although the lower film IF is deformed by folding of the display device DD, a restoration rate of the lower film IF may be increased. Particularly, when the plurality of patterns OP are provided in the bending part BP of the plate PP, the lower film IF may be permeated into the plurality of patterns OP due to a folding stress from the display device which is folded. However, since the lower film IF includes a material having a high restoration force, when the display module DM is unfolded, the lower film IF may be restored to a shape thereof before folding instead of maintaining the deformed shape of the lower film IF in which the lower film IF is permeated into the plurality of patterns OP. Thus, the deformation of the plurality of patterns OP provided to the plate PP may be reduced, thereby preventing or reducing the phenomenon in which the plurality of patterns OP are visually recognized from outside the display device DD.

The upper adhesive layer UAL is disposed between the plate PP and the high restoration layer IPL and attaches the high restoration layer IPL to a lower surface of the plate PP.

The lower adhesive layer LAL may be provided to a lower surface of the high restoration layer IPL. The lower adhesive layer LAL may include a first lower adhesive layer LAL1 (e.g., first adhesive pattern) and a second lower adhesive layer LAL2 (e.g., second adhesive pattern) which are spaced apart from each other at the second folding area FA2. The first lower adhesive layer LAL1 is disposed between the first support plate SP1 and the high restoration layer IPL, and the second lower adhesive layer LAL2 is disposed between the second support plate SP2 and the high restoration layer IPL. Thus, the first support plate SP1 is fixed to the high restoration layer IPL by the first lower adhesive layer LAL1, and the second support plate SP2 is fixed to the high restoration layer IPL by the second lower adhesive layer LAL2.

As described above, as the high restoration layer IPL having a high elastic modulus is provided within the lower film IF, the lower film IF may serve as a buffer film absorbing an external impact thereto. Also, the lower film IF may block foreign substances from being permeated into the plurality of patterns OP at the bending part BP of the plate PP.

FIGS. 6A, 6B, 6C and 6D are enlarged cross-sectional views illustrating embodiments of portion A1 in FIG. 5A.

Figure 6A:
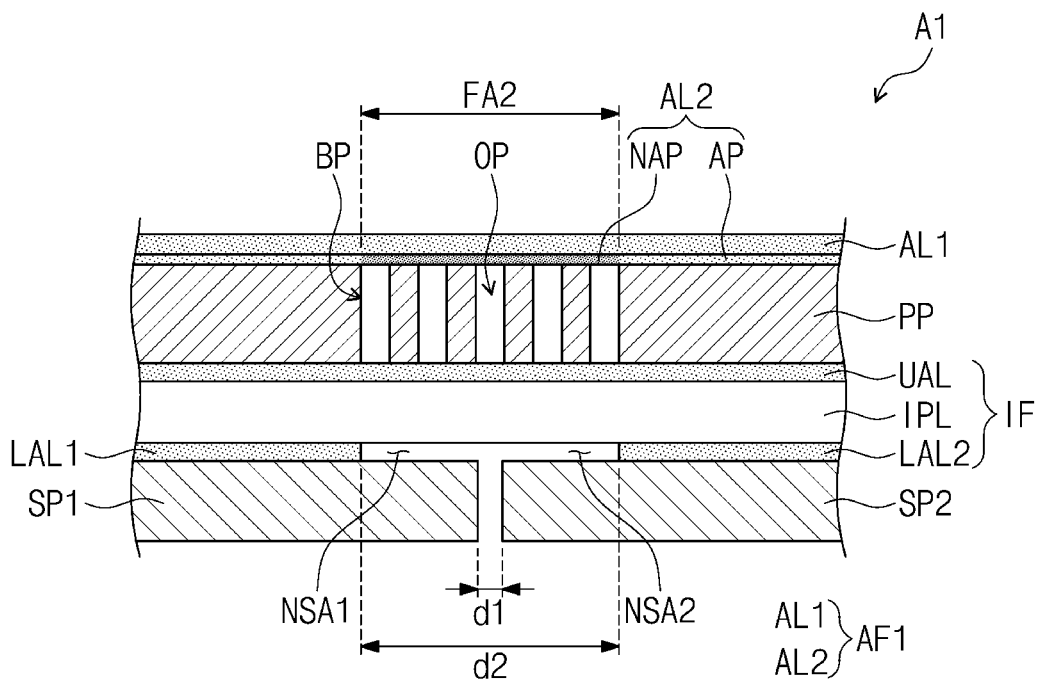
FIG. 6A is an enlarged cross-sectional view of an embodiment of portion A1 in FIG. 5A.

Referring to FIG. 6A, a first adhesive film AF1 is disposed on the plate PP. The first adhesive film AF1 may include a first adhesive layer AL1 and a second adhesive layer AL2 facing each other. The second adhesive layer AL2 may be disposed between the first adhesive layer AL1 and the plate PP. Each of the first and second adhesive layers AL1 and AL2 may include a pressure sensitive adhesive. However, the invention is not limited thereto. Each of the first and second adhesive layers AL1 and AL2 may include an optical clear adhesive ("OCA") or an optical clear resin ("OCR"). The second adhesive layer AL2 may include a photo-curable resin or a thermo-curable resin. In an embodiment, the second adhesive layer AL2 may include an ultraviolet ("UV") curable resin as the photo-curable resin.

The second adhesive layer AL2 may include an adhesive part AP having an adhesive force and a non-adhesive part NAP having no adhesive force. The first adhesive film AF1 may not be attached (e.g., unattached) to the bending part BP of the plate PP by the non-adhesive part NAP. In an embodiment, the non-adhesive part NAP may be defined as an area that is processed such as by a photo-curing or thermo-curing process to remove an adhesive force at the non-adhesive part NAP. When the second adhesive layer AL2 includes the UV curable resin, the non-adhesive part NAP may be an area that is cured through a UV curing process. That is, non-adhesive part NAP of the first adhesive film AF1 is a UV cured area of the first adhesive film AF1. That is, the non-adhesive area in the second adhesive layer AL2 is a photo-cured area or a thermo-cured area of the second adhesive layer AL2. The non-adhesive part NAP may have a hardness greater than a hardness of the adhesive part AP by the curing process.

The non-adhesive part NAP may be provided at a position corresponding to the second folding area FA2. The non-adhesive part NAP may have a width corresponding to the second folding area FA2 along the second direction DR2 and may extend along the first direction DR1. The non-adhesive part NAP may be between the plate PP and a portion of the first adhesive layer AL1. That is, the non-adhesive part NAP may have a thickness which is smaller than a total thickness of the first adhesive film AF1.

The non-adhesive part NAP may overlap or correspond to the bending part BP of the plate PP. Since the non-adhesive part NAP having the high hardness overlaps the bending part BP, although a folding stress is applied to the first adhesive film AF1 during folding of the display device DD, a phenomenon in which the first adhesive film AF1 is permeated into the plurality of patterns OP may be reduced or prevented.

In the display device DD which is flat, the first and second support plates SP1 and SP2 may be spaced apart from each other by a first distance d1. The first distance d1 may be less than the width of the second folding area FA2. Thus, the first and second support plates SP1 and SP2 may partially overlap the second folding area FA2. The first and second support plates SP1 and SP2 may include inner ends which face each other at the second folding area FA2.

The first lower adhesive layer LAL1 is attached to the first support plate SP1, and the second lower adhesive layer LAL2 is attached to the second support plate SP2. The first and second lower adhesive layers LAL1 and LAL2 may be spaced apart from each other by a second distance d2. The first and second lower adhesive layers LAL1 and LAL2 may include inner ends which face each other at the second folding area FA2. The second distance d2 may be greater than the first distance d1. In an embodiment, the second distance d2 may be substantially equal to or less than the width of the second folding area FA2.

When the second distance d2 is greater than the first distance d1, a first non-adhesive area NSA1 may be provided between the first support plate SP1 and the lower film IF, and a second non-adhesive area NSA2 may be provided between the second support plate SP2 and the lower film IF. Thus, in the display device DD which is folded (FIG. 5B), a first inner end of the first support plate SP1 and a second inner end of the second support plate SP2 may be spaced apart from the second folding area FA2 of the display module DM. Referring to FIG. 5B, for example, the inner ends of the first and second support plates SP1 and SP2 may be spaced from the display module DM at an end portion of the display device DD which includes the second folding area FA2.

Figure 6B:
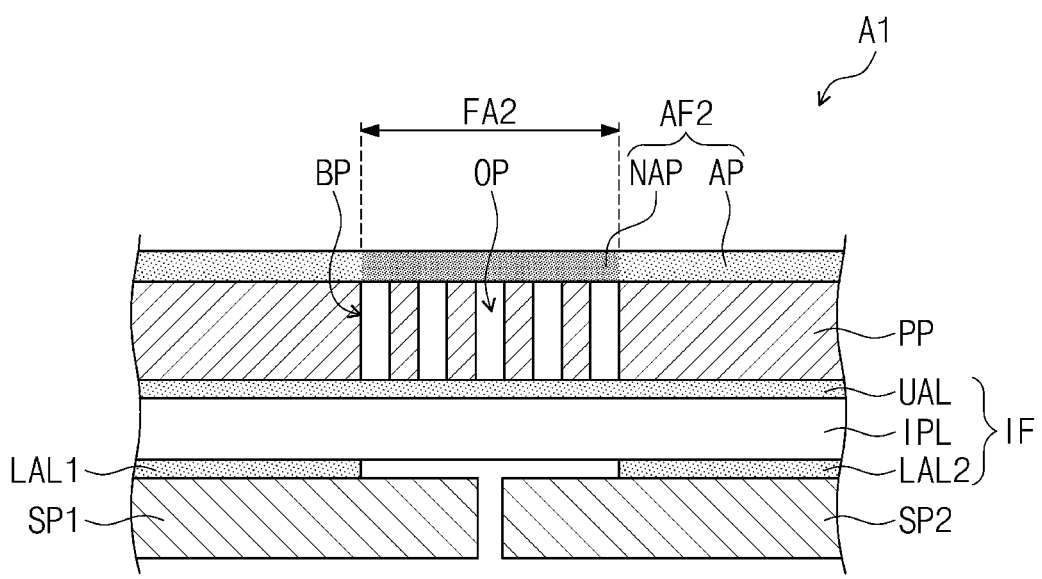
FIG. 6B is an enlarged cross-sectional view of an embodiment of portion A1 in FIG. 5A.

As illustrated in FIG. 6B, a second adhesive film AF2 may include an adhesive part AP having an adhesive force and a non-adhesive part NAP having no adhesive force. The second adhesive film AF2 may have a single-layer structure. That is, the non-adhesive part NAP may have a thickness which is equal to a total thickness of the second adhesive film AF2.

The second adhesive film AF2 may include a pressure sensitive adhesive. However, the invention is not limited thereto. The second adhesive film AF2 may include an optical clear adhesive ("OCA") or an optical clear resin ("OCR"). The second adhesive film AF2 may include a photo-curable resin or a thermo-curable resin. In an embodiment, the second adhesive film AF2 may include a UV curable resin as the photo-curable resin.

The second adhesive film AF2 may not be attached to the bending part BP of the plate PP by the non-adhesive part NAP. In an embodiment, the non-adhesive part NAP may be defined as an area that is processed such as by a photo-curing or thermo-curing process to remove an adhesive force. When the second adhesive film AF2 includes the UV curable resin, the non-adhesive part NAP may be an area that is cured through a UV curing process. After being processed through the UV curing process, the non-adhesive part NAP may have hardness greater than that of the adhesive part AP.

The non-adhesive part NAP may be provided at a position corresponding to the second folding area FA2. The non-adhesive part NAP may have a width corresponding to the second folding area FA2 along the second direction DR2 and may extend along the first direction DR1.

The non-adhesive part NAP may overlap the bending part BP of the plate PP. Since the non-adhesive part NAP having a high hardness overlaps the bending part BP, although a folding stress is applied to the second adhesive film AF2 during folding of the display device DD, a phenomenon in which the second adhesive film AF2 is permeated into the plurality of patterns OP may be reduced or prevented.

Figure 6C:
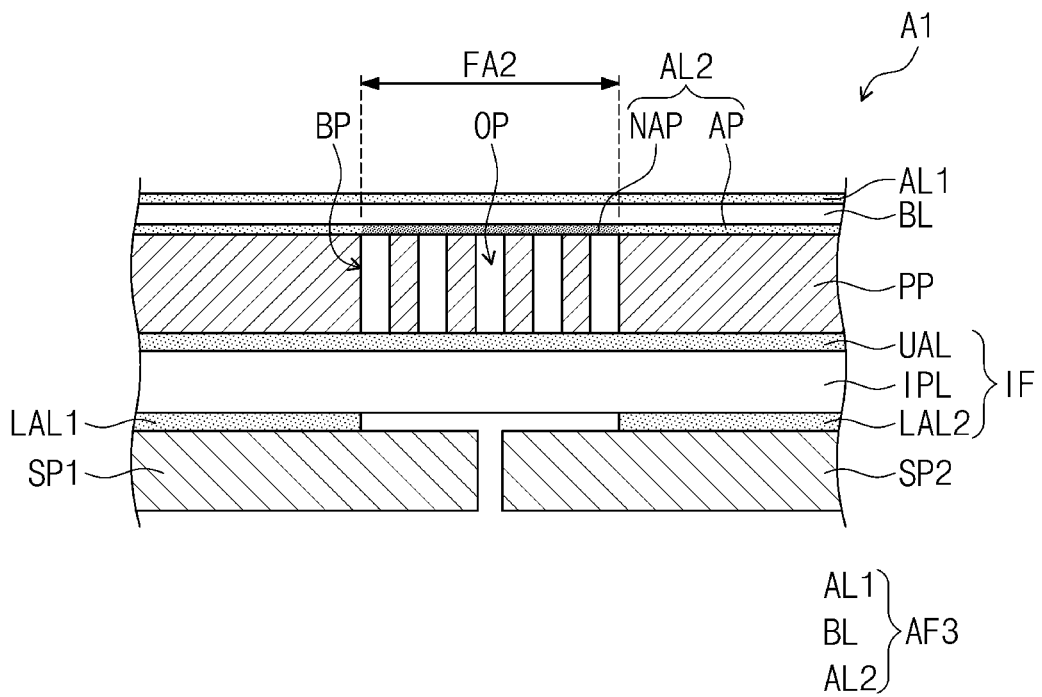
FIG. 6C is an enlarged cross-sectional view of an embodiment of portion A1 in FIG. 5A.

As illustrated in FIG. 6C, a third adhesive film AF3 includes a base layer BL, a first adhesive layer AL1 disposed on the base layer BL, and a second adhesive layer AL2 disposed below the base layer BL. That is, the first adhesive layer AL1 faces the second adhesive layer AL2 with the base layer BL therebetween.

The base layer BL may include a material such as epoxy, silicon, polyimide or polyurethane. Each of the first and second adhesive layers AL1 and AL2 may include a pressure sensitive adhesive. The second adhesive layer AL2 may further include a photo-curable resin or a thermo-curable resin. In an embodiment, the second adhesive layer AL2 may include a UV curable resin as the photo-curable resin. The second adhesive layer AL2 may include an adhesive part AP having an adhesive force and a non-adhesive part NAP having no adhesive force. That is, the second adhesive layer AL2 may have the same structure as the second adhesive layer AL2 in FIG. 6A.

Since the non-adhesive part NAP having a high hardness overlaps the bending part BP, although a folding stress is applied to the third adhesive film AF3 during folding of the display device DD, a phenomenon in which the third adhesive film AF3 is permeated into the plurality of patterns OP may be reduced or prevented.

Figure 6D:
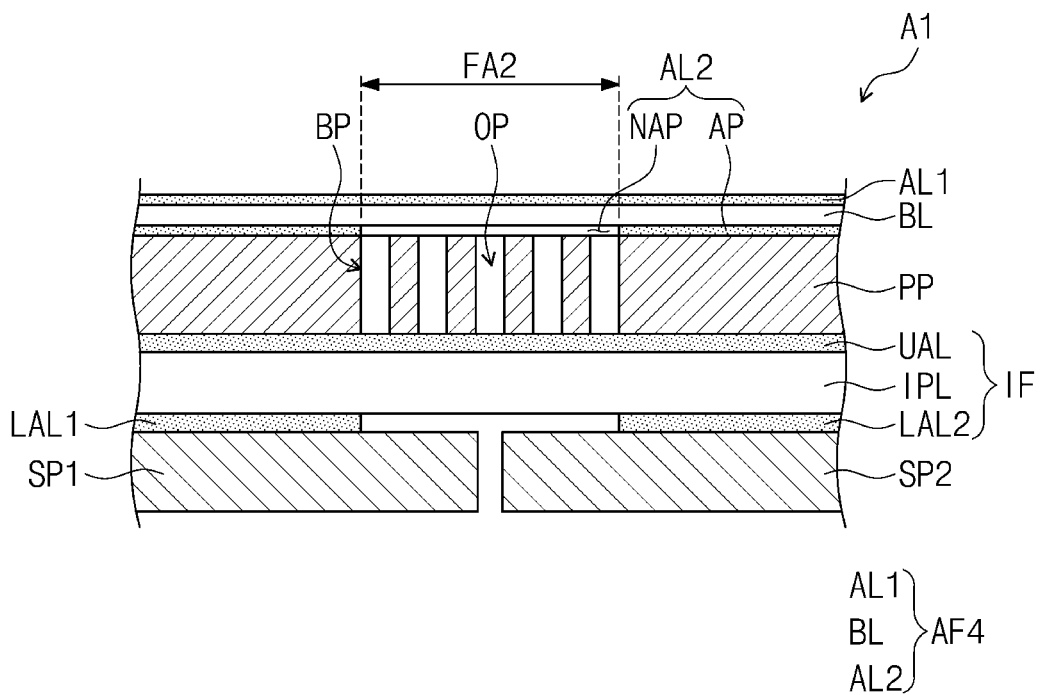
FIG. 6D is an enlarged cross-sectional view of an embodiment of portion A1 in FIG. 5A.

As illustrated in FIG. 6D, a fourth adhesive film AF4 includes a base layer BL, a first adhesive layer AL1 disposed on the base layer BL, and a second adhesive layer AL2 disposed below the base layer BL. The second adhesive layer AL2 may include an adhesive part AP having an adhesive force and a non-adhesive part NAP having no adhesive force. Here, the non-adhesive part NAP may be defined as an area which material of the second adhesive layer AL2 is excluded such as by removing a material portion of the second adhesive layer AL2. Thus, the non-adhesive part NAP may be defined as a void in the second adhesive layer AL2 which is provided between the base layer BL and the bending part BP of the plate PP.

Thus, since a void is provided between the bending part BP and the fourth adhesive film AF4 by the non-adhesive part NAP, although a folding stress is applied to the fourth adhesive film AF4 during folding of the display device DD, a phenomenon in which the fourth adhesive film AF4 is permeated into the plurality of patterns OP may be reduced or prevented. As a result, the deformation of the plurality of patterns OP provided to the bending part BP of the plate PP may be reduced to prevent or reduce the phenomenon in which the plurality of patterns OP are visually recognized.

Figure 7A:
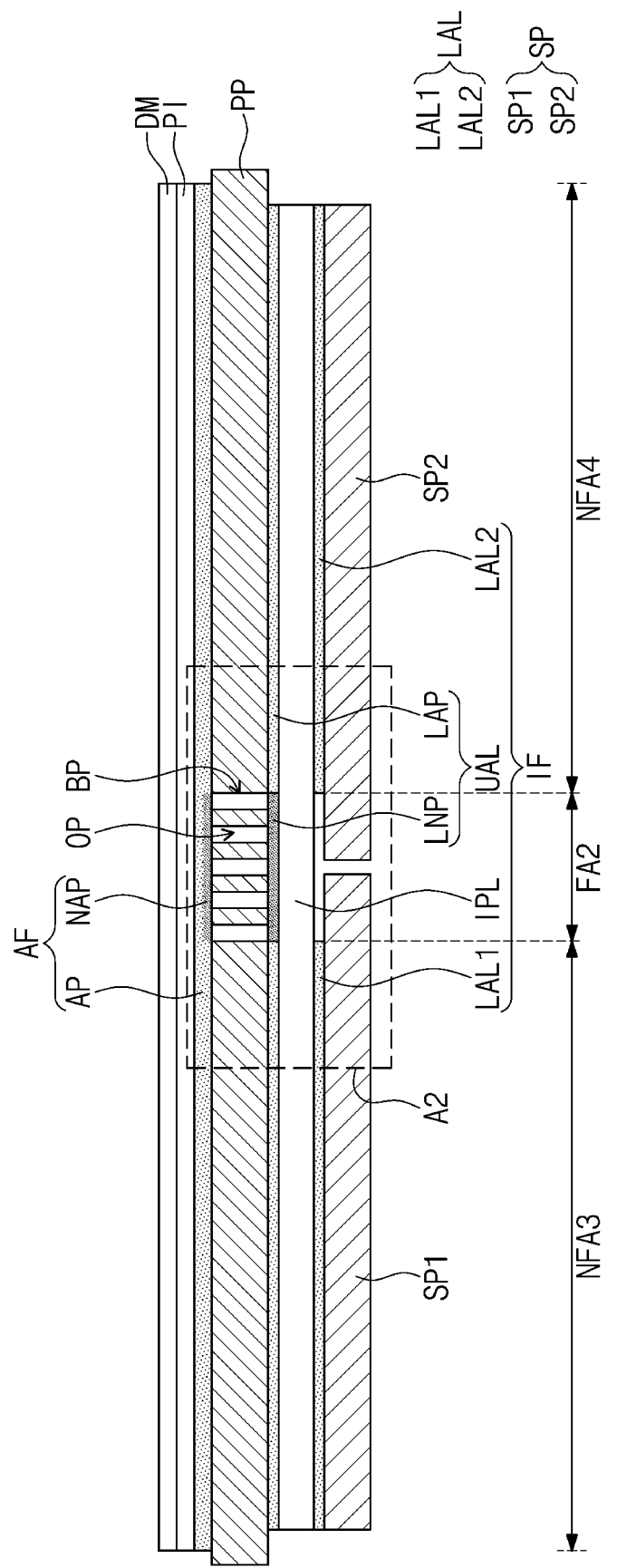
FIG. 7A is a cross-sectional view illustrating an embodiment of a display device which is unfolded.
Figure 7B:
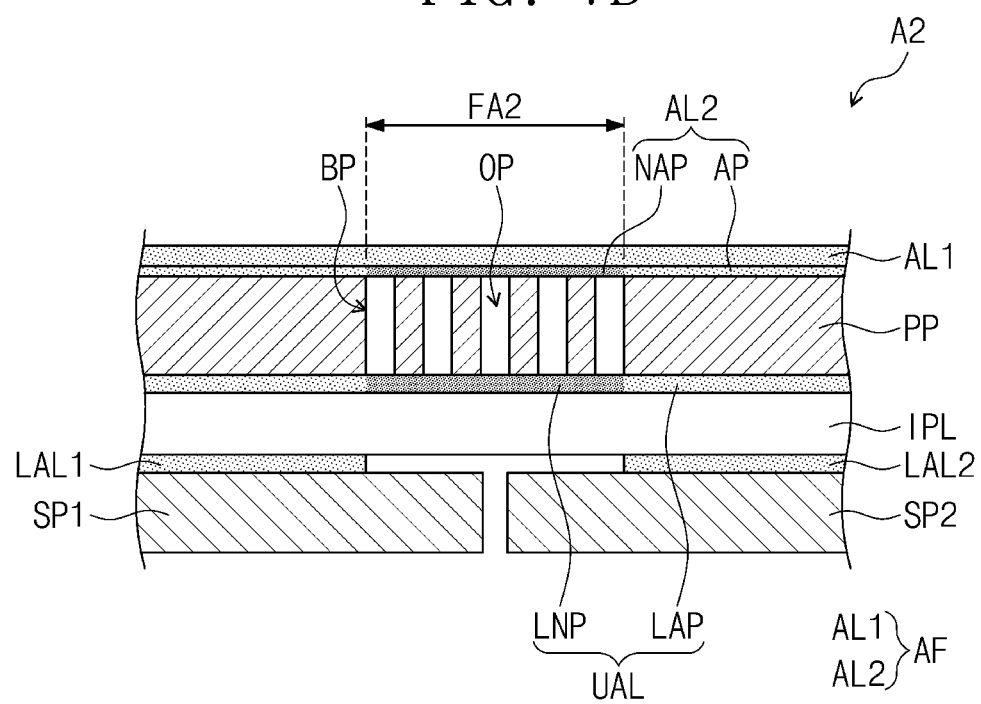
FIG. 7B is an enlarged cross-sectional view of an embodiment of portion A2 in FIG. 7A.

FIG. 7A is a cross-sectional view illustrating an embodiment of the display device DD which is unfolded or flat, and FIG. 7B is an enlarged cross-sectional view illustrating an embodiment of portion A2 in FIG. 7A.

Referring to FIGS. 4, 7A and 7B, in the display device DD, the lower module LM may further include a lower film IF. The lower film IF includes a high restoration layer IPL, an upper adhesive layer UAL disposed between the plate PP and the high restoration layer IPL, and a lower adhesive layer LAL disposed on a rear surface of the high restoration layer IPL.

The upper adhesive layer UAL is disposed between the plate PP and the high restoration layer IPL and attaches the high restoration layer IPL to a lower surface of the plate PP. The upper adhesive layer UAL may include a lower adhesive part LAP having an adhesive force and a lower non-adhesive part LNP (e.g., lower non-adhesive area) having no adhesive force. The upper adhesive layer UAL may include a pressure sensitive adhesive. The upper adhesive layer UAL may include a photo-curable resin or a thermo-curable resin. In an embodiment, the upper adhesive layer UAL may include a UV curable resin as the photo-curable resin.

The lower non-adhesive part LNP may be provided at a position corresponding to the second folding area FA2. The lower non-adhesive part LNP may have a width corresponding to the second folding area FA2 along the second direction DR2 and may extend along the first direction DR1. The lower non-adhesive part LNP may overlap or correspond to the bending part BP of the plate PP. The lower film IF may not be attached to the bending part BP of the plate PP by the lower non-adhesive part LNP.

In an embodiment, the lower non-adhesive part LNP may be defined as an area that is processed such as by a photo-curing or thermo-curing process to remove an adhesive force. When the upper adhesive layer UAL includes the UV curable resin, the lower non-adhesive part LNP may be an area that is cured through a UV curing process. After processed through the UV curing process, the lower non-adhesive part LNP may have a hardness greater than a hardness of the lower adhesive part LAP. Since the lower non-adhesive part LNP having the high hardness overlaps the bending part BP, although a folding stress is applied to the lower film IF during folding of the display device DD, deformation of the upper adhesive layer UAL may be reduced. Thus, a phenomenon in which the upper adhesive layer UAL is permeated into the plurality of patterns OP may be reduced or prevented, and as a result, the deformation of the plurality of patterns OP provided to the bending part BP of the plate PP may be reduced.

When the lower film IF has a structure in which the upper adhesive layer UAL includes the lower non-adhesive part LNP, the high restoration layer IPL may include a material having an elastic modulus less than an elastic modulus of the high restoration layer IPL in FIGS. 5A and 5B. In an embodiment, for example, the high restoration layer IPL in FIG. 7A may include thermoplastic polyurethane, and the high restoration layer IPL in FIG. 5A may include polyurethane. That is, when the upper adhesive layer UAL includes the lower non-adhesive part LNP, since deformation of the lower film IF caused by the folding stress is reduced, the high restoration layer IPL of the lower film IF may not include a material having a high elastic modulus. Also, when the upper adhesive layer UAL includes the lower non-adhesive part LNP, the high restoration layer IPL may have a thickness less than that of the high restoration layer IPL in FIGS. 5A and 5B.

Figure 8A:
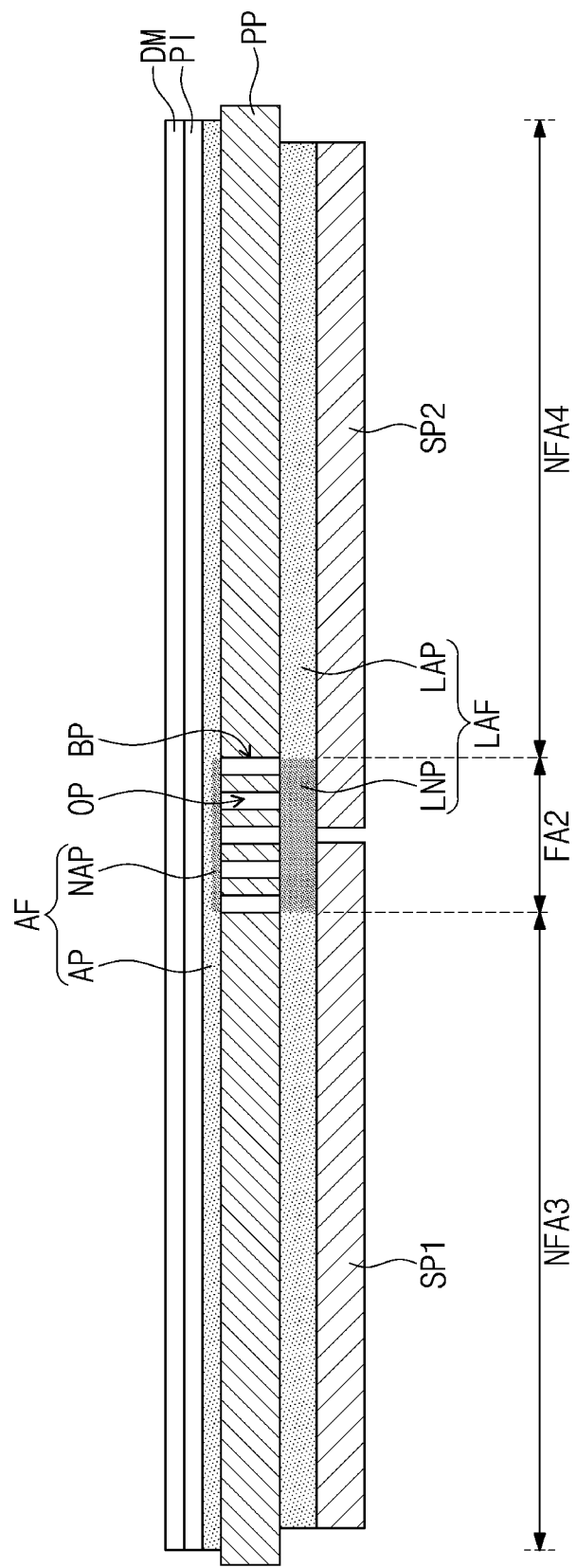
FIG. 8A is a cross-sectional view illustrating an embodiment of a display device which is unfolded.
Figure 8B:
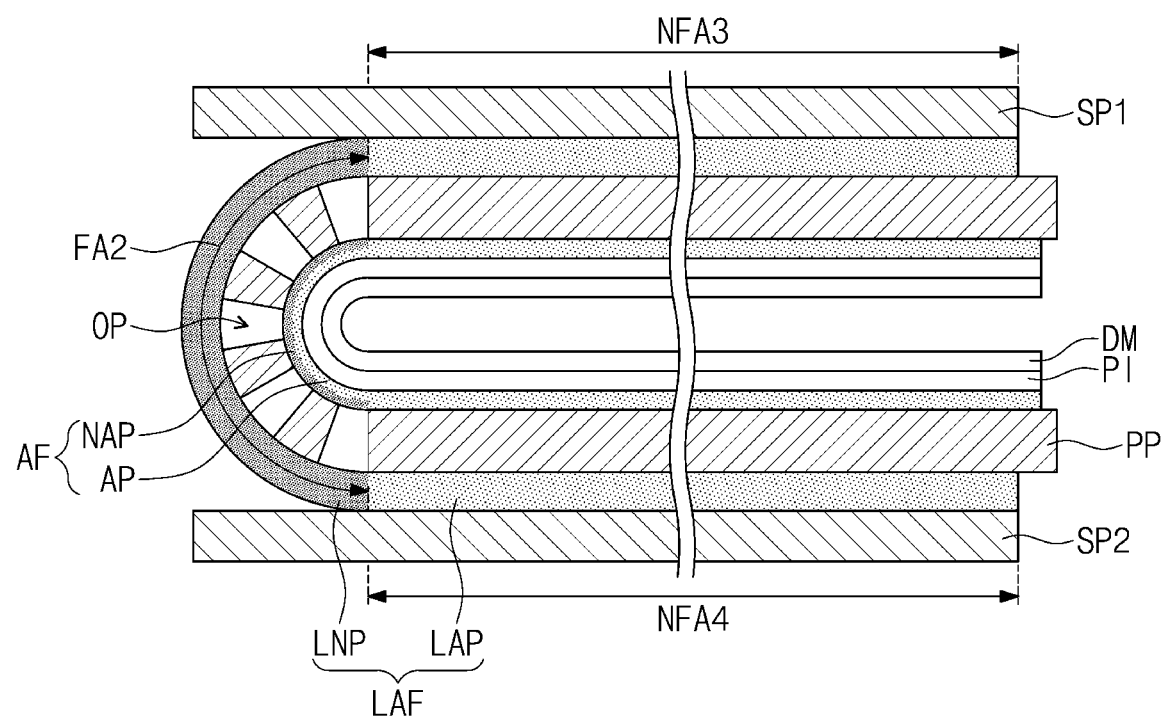
FIG. 8B is a cross-sectional view illustrating the display device of FIG. 8A which is folded.

FIG. 8A is a cross-sectional view illustrating an embodiment of the display device DD which is unfolded or flat, and FIG. 8B is a cross-sectional view illustrating the display device DD of FIG. 8A which is folded.

Referring to FIGS. 4, 8A and 8B, in the display device DD, the lower module LM may further include a lower adhesive film LAF. The lower adhesive film LAF may have a single-layer structure.

The lower adhesive film LAF may include a lower adhesive part LAP having an adhesive force and a lower non-adhesive part LNP having no adhesive force. The lower adhesive film LAF may include a pressure sensitive adhesive. The lower adhesive film LAF may include a photo-curable resin or a thermo-curable resin. In an embodiment, the lower adhesive film LAF may include a UV curable resin as the photo-curable resin.

The lower non-adhesive part LNP may be provided at a position corresponding to the second folding area FA2. The lower non-adhesive part LNP may overlap or correspond to the bending part BP of the plate PP on the plane. The lower adhesive film LAF may not be attached to the bending part BP of the plate PP by the lower non-adhesive part LNP. Also, the lower adhesive film LAF may not be attached to the first and second support plates SP1 and SP2 in the second folding area FA2 by the lower non-adhesive part LNP.

In an embodiment, the lower non-adhesive part LNP may be defined as an area that is processed such as by a photo-curing or thermo-curing process. When the lower adhesive film LAF includes the UV curable resin, the lower non-adhesive part LNP may be an area that is cured through a UV curing process. The lower non-adhesive part LNP may lose an adhesive force by the curing process and have a hardness greater than a hardness of the lower adhesive part LAP. Since the lower non-adhesive part LNP having the high hardness overlaps the bending part BP, although a folding stress is applied to the lower adhesive film LAF during folding of the display device DD, deformation of the lower adhesive film LAF may be reduced. That is, a phenomenon in which the lower adhesive film LAF is permeated into the plurality of patterns OP during the folding operation may be reduced or prevented.

Also, in the display device DD which is unfolded or flat, the first support plate SP1 overlaps the lower non-adhesive part LNP, and the second support plate SP2 overlaps the lower non-adhesive part LNP. However, the first and second support plates SP1 and SP2 are not attached to the lower non-adhesive part LNP because the adhesive force of the lower non-adhesive part LNP is excluded or removed through the UV curing process. Thus, referring to FIG. 8B, when the display module DM which is unfolded is folded, the first and second support plates SP1 and SP2 may be separated from the lower non-adhesive part LNP.

FIG. 9 is a cross-sectional illustrating an embodiment of the display device DD which is unfolded or flat.

Referring to FIGS. 4 and 9, in the display device DD, the lower module LM further includes a cushion layer CHL. The cushion layer CHL may be disposed below the support plate SP. The cushion layer CHL may include a sponge, a foam or a urethane resin. Alternatively, an adhesive member may be further disposed between the cushion layer CHL and the support plate SP.

The cushion layer CHL may include a first cushion layer CHL1 and a second cushion layer CHL2. The first cushion layer CHL1 is disposed below the first support plate SP1, and the second cushion layer CHL2 is disposed below the second support plate SP2. In an embodiment, each of the first and second cushion layers CHL1 and CHL2 may have a thickness of about 100 µm. The cushion layer CHL may prevent plastic deformation and a pressed phenomenon of the support plate SP and the plate PP caused by an external impact and force. That is, the cushion layer CHL may improve an impact resistance of the display device DD.

Particularly, when the cushion layer CHL is disposed below the support plate SP, the impact resistance of the display device DD may be improved in comparison with a structure in which the cushion layer CHL is disposed on the plate PP. The impact resistance may be checked through a point impact test or a surface impact test. A point impact corresponds to an impact applied to the display device DD when a sharp unit such as a pen is dropped from a predetermined height. A surface impact refers to an impact applied by a unit such as a ball. The surface impact test measures an amount of an impact load absorbed by the display device DD when a ball having a predetermined size and weight is dropped.

Test results obtained by performing the point impact test on a first structure in which the cushion layer CHL is disposed on the plate PP and a second structure in which the cushion layer CHL is disposed below the support plate SP under the same condition show that the second structure absorbs an impact from a height of about 9 centimeters (cm) whereas the first structure absorbs an impact from a height of about 4 cm. That is, it may be known that the impact resistance is improved when the cushion layer CHL is disposed below the support plate SP.

Although not shown in the drawing, the display device DD in FIGS. 7A and 8A may also further include the cushion layer CHL disposed below the support plate SP.

In an embodiment, the lower module LM may further include a step compensation film SCL. The step compensation film SCL may be disposed below the plate PP. The step compensation film SCL may be provided to an area that is not overlapped with the lower film IF and the support plate SP. That is, the display device DD which is unfolded or flat disposes the step compensation film SCL coplanar with the lower film IF and the support plate SP. Thus, a step between an area in which the lower film IF and the support plate SP are disposed and an area in which the lower film IF and the support plate SP are not disposed may be compensated by a thickness of the step compensation film SCL.

The step compensation film SCL may include at least one adhesive member. The step compensation film SCL may be fixed to a rear surface of the plate PP by the adhesive member.

The step compensation film SCL may include a first step compensation film SCL1 disposed adjacent to the first support plate SP1 and a second step compensation film SCL2 disposed adjacent to the second support plate SP2. An outer end of each of the first support plate SP1 and the second support plate SP2 may face the first step compensation film SCL1 and the second step compensation film SCL2, respectively. The first and second step compensation films SCL1 and SCL2 may be spaced apart from the second folding area FA2 with the support plate SP therebetween.

According to one or more embodiment, the plate PP which supports the display module DM includes the bending part BP defined in correspondence to the folding area of the display module DM and in which the plurality of patterns OP are provided. The adhesive film AF provided between the display module DM and the plate PP includes the non-adhesive part NAP in which the adhesive force is reduced or removed in correspondence to the bending part BP to reduce the deformation of the plurality of patterns OP.

The non-adhesive part NAP of the adhesive film AF may prevent the deformation of the plurality of patterns OP generated as the adhesive film AF is permeated into the plurality of patterns OP during folding of the display device DD, thereby resolving the phenomenon in which the patterns OP are visually recognized from outside the display device DD. Thus, one or more embodiment of the invention may provide the display device DD having the improved product reliability.

Although embodiments of the invention have been described, it is understood that the invention should not be limited to these embodiments but various changes and modifications can be made by one ordinary skilled in the art within the spirit and scope of the invention as hereinafter claimed. Hence, the real protective scope of the invention shall be determined by the technical scope of the accompanying claims.

What is claimed is:

1. A display device comprising:
   a display panel which is foldable at a folding area of the display panel;
   a plate which faces the display panel along a thickness direction of the display panel and is foldable together with the display panel, the plate comprising:
      a bending portion corresponding to the folding area;
      a plurality of patterns defined in the plate at the bending portion thereof; and
      a plurality of support bars spaced apart from each other by the plurality of patterns at the bending portion;
      a support plate which is disposed below the plate, the support plate comprising a first support plate and a second support plate spaced apart from each other along a first direction, at the bending portion of the plate;
   a first adhesive layer which is between the plate and the display panel;
   a second adhesive layer which is between the first adhesive layer and the plate; and
   a base layer between the first adhesive layer and the second adhesive layer,
   wherein
   the second adhesive layer includes:
      an adhesive area which attaches the plate to the base layer, and
      a non-adhesive area formed by removal of a portion of the second adhesive layer to provide a void in the second adhesive layer which is between the base layer and each of the plurality of support bars, respectively, and corresponds to the bending portion.

2. The display device of claim 1, wherein the non-adhesive area corresponds to the plurality of patterns in the plate.

3. The display device of claim 1, further comprising a lower film facing the display panel with the plate therebetween.

4. The display device of claim 3, wherein the lower film comprises:
   a shape restoring layer;

an upper adhesive layer between the plate and the shape restoring layer; and a lower adhesive layer facing the upper adhesive layer with the shape restoring layer therebetween.

5. The display device of claim 4, wherein the shape restoring layer comprises polyurethane.

6. The display device of claim 4, wherein the support plate faces the plate with the lower film therebetween, wherein within the lower film, the lower adhesive layer comprises:
  a first lower adhesive layer which is between the first support plate and the shape restoring layer; and
  a second lower adhesive layer which is between the second support plate and the shape restoring layer and spaced apart from the first lower adhesive layer at the bending portion of the plate.

7. The display device of claim 4, wherein within the lower film, the upper adhesive layer comprises a lower non-adhesive area corresponding to the bending portion of the plate.

8. The display device of claim 7, wherein within the lower film, the upper adhesive layer comprises an ultraviolet curable resin, and the lower non-adhesive area is an ultraviolet cured area of the upper adhesive layer.

9. The display device of claim 1, further comprising a lower adhesive film facing the display panel with the plate therebetween, wherein the lower adhesive film comprises a lower non-adhesive area corresponding to the bending portion of the plate.

10. The display device of claim 9, wherein the lower adhesive film comprises an ultraviolet curable resin, and the lower non-adhesive area of the lower adhesive film is an ultraviolet cured area of the lower adhesive film.

11. The display device of claim 1, further comprising:

a cushion layer facing the plate with the support plate therebetween.

12. The display device of claim 11, wherein the cushion layer comprises:

a first cushion layer facing the plate with the first support plate therebetween; and a second cushion layer facing the plate with the second support plate therebetween and spaced apart from the first cushion layer at the bending portion of the plate.

13. The display device of claim 1, wherein the folding area of the display panel has a width along the first direction, and a distance between the first support plate and the second support plate is less than the width of the folding area.

14. The display device of claim 13, wherein each of the plate, the first support plate and the second support plate comprises a metal material.

15. The display device of claim 1, further comprising a protection film between the first adhesive layer and the display panel.

16. An electronic device comprising:

a display panel which is foldable at a folding area of the display panel;

a plate which faces the display panel along a thickness direction of the display panel and is foldable together with the display panel, the plate comprising:
  a bending portion corresponding to the folding area;
  a plurality of patterns defined in the plate at the bending portion thereof; and
  a plurality of support bars spaced apart from each other by the plurality of patterns at the bending portion;

a first adhesive layer which is between the plate and the display panel;

a second adhesive layer which is between the first adhesive layer and the plate; and a base layer between the first adhesive layer and the second adhesive layer, wherein the second adhesive layer includes:
  an adhesive area which attaches the plate to the base layer, and
  a non-adhesive area formed by removal of a portion of the second adhesive layer to provide a void in the second adhesive layer which is between the base layer and each of the plurality of support bars, respectively, and corresponds to the bending portion.

* * * * *